United States Patent
Stevens

(10) Patent No.: US 6,867,062 B2
(45) Date of Patent: Mar. 15, 2005

(54) METHOD FOR FORMING LIGHT SHIELD PROCESS FOR SOLID-STATE IMAGE SENSOR WITH MULTI-METALLIZATION LAYER

(75) Inventor: Eric G. Stevens, Webster, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 10/641,724

(22) Filed: Aug. 15, 2003

(65) Prior Publication Data

US 2005/0035422 A1 Feb. 17, 2005

(51) Int. Cl.$^7$ ............................................... H01L 21/00
(52) U.S. Cl. ............................. 438/57; 438/75; 438/98
(58) Field of Search ............................ 438/57, 75, 98; 257/222, 223, 234

(56) References Cited

U.S. PATENT DOCUMENTS 5,719,075 A * 2/1998 Hawkins et al. ............... 438/75
5,846,708 A * 12/1998 Hollis et al. .................... 435/6
2003/0001222 A1 * 1/2003 Street et al. ................. 257/444

* cited by examiner

Primary Examiner—William M. Brewster
(74) Attorney, Agent, or Firm—Peyton C. Watkins

(57) ABSTRACT

An image sensor includes a substrate containing photosensitive areas; an insulator spanning the substrate; and a first and second layer of a multi-layer metalization structure wherein the first layer forms the light shield regions over portions of the photosensitive area as well as forming circuit interconnections and barrier regions to prevent spiking into the substrate or gates at contacts in the non-imaging area, and the second layer spanning the interconnections and barrier regions of the first layer only over the non-imaging area.

3 Claims, 2 Drawing Sheets

METHOD FOR FORMING LIGHT SHIELD PROCESS FOR SOLID-STATE IMAGE SENSOR WITH MULTI-METALLIZATION LAYER

FIELD OF THE INVENTION

The invention relates generally to the field of light shields used on solid-state image sensors and, more particularly, to such light shields formed by sequential and selective etching of a bi-metal structure that is also used to form the electrical interconnections on the device.

BACKGROUND OF THE INVENTION

Currently, image sensors are made of photosensitive sites, or pixels, over a portion of which light shields are disposed. These light shields are used to prevent light from entering certain portions of the pixel where it is not desired, e.g., over the vertical shift registers of an interline CCD imager. These image sensors also contain electrical interconnects or bus lines around the periphery of the photosensitive sites for passing electrical signals to processing circuitry on the chip.

To improve the optical performance of the image sensor, it is desirable to make the light shield regions relatively thin, as is well known in the art. Conversely, to improve the electrical performance of the interconnects, it is desirable to make them relatively thick to improve their conductivity. Due to these competing requirements, the light-shield and interconnect regions are typically formed using separate and isolated layers. This adds to process complexity. Furthermore, the additional isolation layer(s) between the light-shield and interconnect region can result in degraded optical performance, in a similar way that having a thick light shield would.

Subsequently, a need exists for improving the performance of such image sensors with simplified manufacturing methods and materials.

SUMMARY OF THE INVENTION

The present invention is directed to overcoming one or more of the problems set forth above. Briefly summarized, according to one aspect of the present invention, the invention resides in an image sensor having a substrate containing photosensitive areas; an insulator spanning the substrate; and a first and second layer of a multi-layer metalization structure wherein the first layer forms light shield regions over select portions of the photosensitive area as well as forming circuit interconnections and barrier regions to prevent spiking into the substrate or gates at contacts in the non-imaging area, and the second layer spanning the interconnections and barrier regions of the first layer only over the non-imaging area.

These and other aspects, objects, features and advantages of the present invention will be more clearly understood and appreciated from a review of the following detailed description of the preferred embodiments and appended claims, and by reference to the accompanying drawings.

ADVANTAGEOUS EFFECT OF THE INVENTION

The present invention has the advantage of providing thin light shields that are formed by sequential and selective etching of a thick, bi-metal structure that is also used to form the electrical interconnections on a solid-state image sensor.

DETAILED DESCRIPTION OF THE INVENTION

Figure 1:
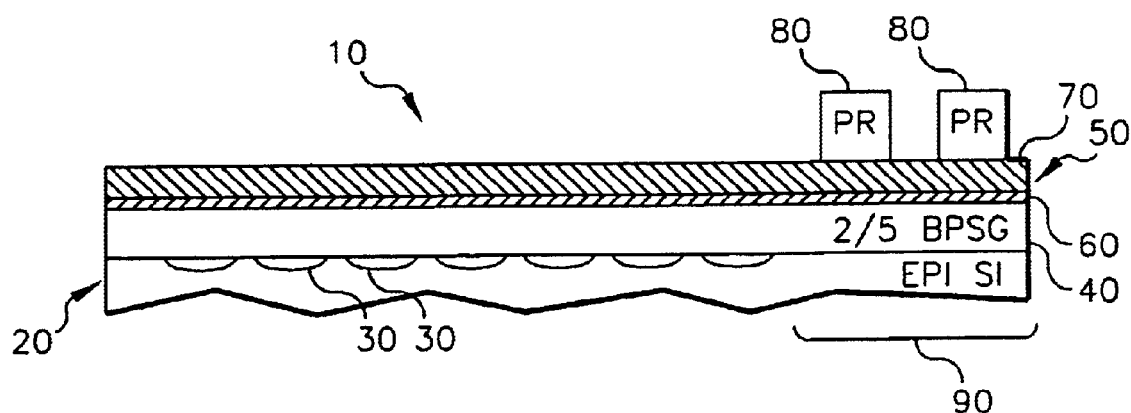
FIG. 1 is a side view in cross section of the image formed by the present invention.

Referring to FIG. 1 of the preferred embodiment, there is shown an initial stage of forming an image sensor 10 of the present invention. This stage includes providing a substrate 20 having a plurality of photosensitive sites 30 that converts incident light into charge packets. An insulator 40 spans and covers the substrate, and a bi-metal structure 50 is disposed spanning and covering the insulator. Embedded within the insulator, may be other structure(s) such as gate electrodes, etc, which are not shown. The bi-metal structure 50 is preferably formed by two individual, adjacent and abutting layers where one layer is an alloy of titanium and tungsten 60 and the other layer is aluminum (or an alloy of aluminum and silicon) 70. Photoresist 80 is selectively disposed spanning and covering a portion of the layer of aluminum 70 that is in the non-imaging area 90. This non-imaging area 90 contains circuitry and other things such as the bus lines that will be used in operating the image sensor 10.

Figure 2:
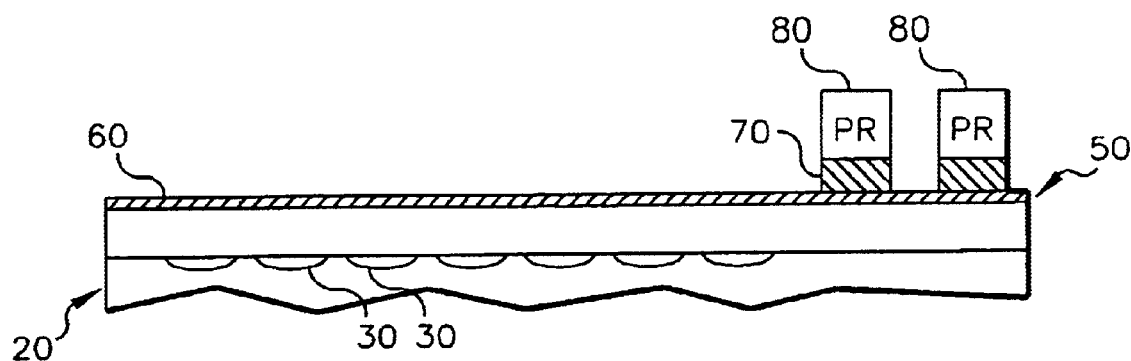
FIG. 2 is a side view in cross section of a subsequent step in forming the image sensor of FIG. 1.

Referring to FIG. 2 of the preferred embodiment, there is shown the step of entirely etching the aluminum 70 over the photosensitive sites 30 with a chlorine-based etchant that etches the aluminum 70 but will not etch the tungsten and titanium alloy layer 60. The aluminum 70 over the non-imaging portion 90 is selectively etched in accordance with the patterned photoresist 80.

Figure 3:
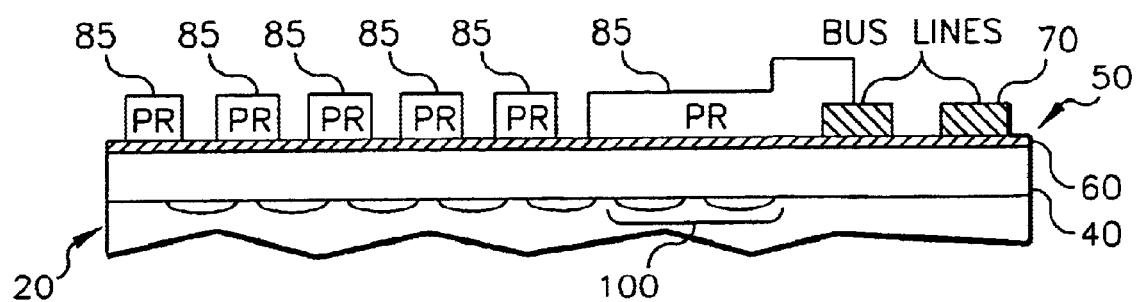
FIG. 3 is a side view in cross section of a subsequent step of FIG. 2 in forming the image sensor of FIG. 1.

Referring to FIG. 3 of the preferred embodiment, there is shown photoresist 85 selectively patterned over portions of the titanium and tungsten alloy layer 60 spanning the photosensitive sites 30. Photoresist 85 is also patterned over the tungsten and titanium alloy layer 60 spanning the dark reference pixels or sites 100, and over the combination of titanium, tungsten 60 and aluminum 70 spanning the bus lines. Photoresist 85 may also be optionally patterned over the circuitry and bus lines in the non-imaging portion 90. Also note that in the preceding steps of patterning and etching the aluminum 70, that a portion of the aluminum layer 70 may be optionally left covering these dark reference pixels 100.

Figure 4:
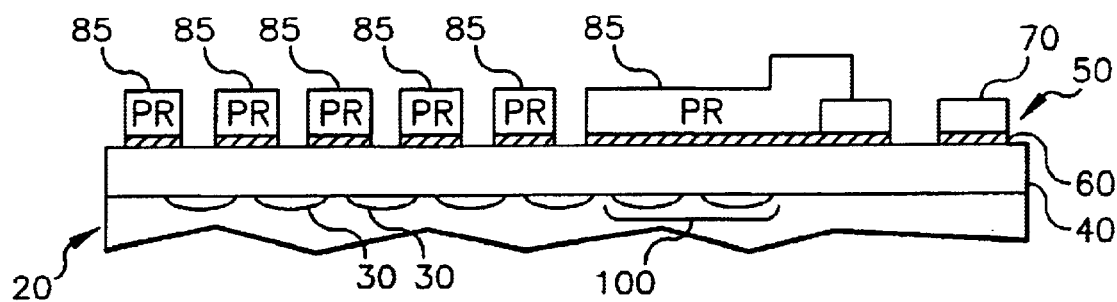
FIG. 4 is a side view in cross section of a subsequent step of FIG. 3 in forming the image sensor of FIG. 1.

Referring to FIG. 4 of the preferred embodiment, there is shown the step of etching the tungsten and titanium alloy layer 60 in accordance with the patterned photoresist 85 with a fluorine-based etchant. This etchant etches the titanium and tungsten alloy layer 60, but does not etch the insulation layer 40 or any exposed and remaining portions of the aluminum layer 70.

Figure 5:
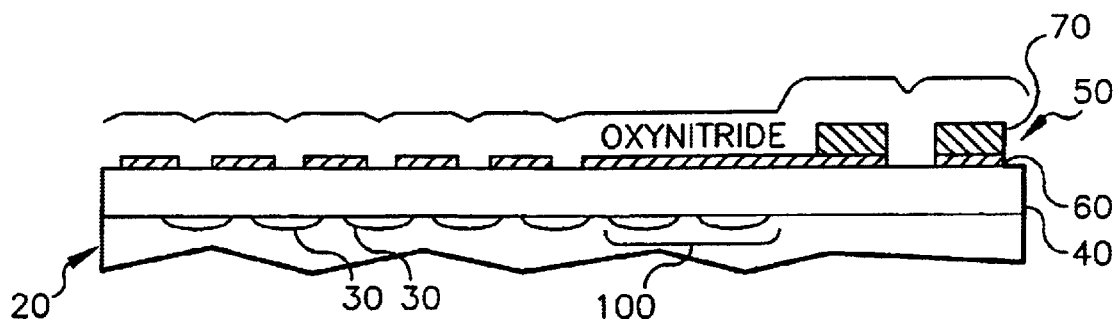
FIG. 5 is a side view in cross section of a subsequent step of FIG. 4 in forming the image sensor of FIG. 1.

Referring to FIG. 5 of the preferred embodiment, there is shown the step of stripping the photoresist 85 and continuing with the process. The remaining steps needed for completion of a commercially usable image sensor are well known in the art and will not be discussed in detail herein.

The invention has been described with reference to a preferred embodiment. However, it will be appreciated that variations and modifications can be effected by a person of ordinary skill in the art without departing from the scope of the invention. For example, use of other multi-layer metal structure materials and their corresponding selective etchants may be employed to create the invention.

PARTS LIST

10 image sensor
20 substrate
30 photo sensitive sites
40 insulator
50 bi-metal structure
60 titanium and tungsten alloy
70 aluminum
80 photoresist
85 photoresist
90 non-imaging area
100 dark reference pixels

What is claimed is:

1. A method for forming an image sensor comprising the steps of:
   (a) providing a substrate having a plurality of photosensitive areas;
   (b) providing an insulator spanning the substrate;
   (c) providing a multi-layer metalization structure having at least first and second layers that spans the insulator;
   (d) etching away the second layer of multi-layer metalization structure spanning the photosensitive areas with a first etchant that selectively etches the second layer but not the first layer;
   (e) depositing and patterning, in a shape that defines the to-be-formed apertures, a masking layer spanning the first layer; and
   (f) etching through the first layer with a second etchant that etches the first layer but not the insulator or second layer materials for forming the apertures.

2. The method as in claim 1, wherein the second layer is aluminum or an alloy of aluminum and silicon and the first etchant is of a chlorine-based composition.

3. The method as in claim 1, wherein the first metal layer is an alloy of titanium and tungsten and the second etchant is of a fluorine-based composition.

* * * * *